United States Patent
Ruile et al.

(10) Patent No.: US 8,674,583 B2
(45) Date of Patent: Mar. 18, 2014

(54) CONSTRUCTION ELEMENT THAT OPERATES WITH ACOUSTIC WAVES, AND METHOD FOR THE MANUFACTURE THEREOF

(75) Inventors: Werner Ruile, München (DE); Markus Hauser, Feldafing (DE); Ingo Bleyl, Munich (DE); Gerd Riha, Nußdorf (DE)

(73) Assignee: EPCOS AG (DE)

( * ) Notice: Subject to any disclaimer, the term of this patent is extended or adjusted under 35 U.S.C. 154(b) by 100 days.

(21) Appl. No.: 13/139,756

(22) PCT Filed: Dec. 16, 2009

(86) PCT No.: PCT/EP2009/067306
§ 371 (c)(1),
(2), (4) Date: Sep. 26, 2011

(87) PCT Pub. No.: WO2010/070000
PCT Pub. Date: Jun. 24, 2010

(65) Prior Publication Data
US 2012/0007475 A1    Jan. 12, 2012

(30) Foreign Application Priority Data
Dec. 17, 2008 (DE) .......................... 10 2008 062 605

(51) Int. Cl.
*H01L 41/08* (2006.01)

(52) U.S. Cl.
USPC ....................................................... 310/313 R

(58) Field of Classification Search
USPC ........................................ 310/313 R, 313 B
See application file for complete search history.

(56) References Cited

U.S. PATENT DOCUMENTS

| | | | |
|---|---|---|---|
| 3,760,204 A | | 9/1973 | Yester, Jr. |
| 4,353,046 A | * | 10/1982 | Hartmann ...................... 333/194 |
| 7,696,674 B2 | * | 4/2010 | Roesler et al. ................ 310/358 |
| 8,258,895 B2 | * | 9/2012 | Ruile et al. ..................... 333/193 |
| 2003/0025422 A1 | * | 2/2003 | Watanabe et al. ............. 310/348 |
| 2010/0231330 A1 | | 9/2010 | Ruile et al. |

FOREIGN PATENT DOCUMENTS

| DE | 10 2007 012 383 A1 | 9/2008 |
|---|---|---|
| DE | 10 2007 012 384 A1 | 9/2008 |
| EP | 0 063 586 B1 | 11/1982 |
| EP | 1 274 167 A2 | 1/2003 |
| EP | 1 391 988 A2 | 2/2004 |

OTHER PUBLICATIONS

C.S. Hartmann et al., "An Analysis of SAW Interdigital Transducers with Internal Reflections and the Application to the Design of Single-Phase Unidirectional Transducers," IEEE Ultrasonics Symposium, 1982, pp. 40-45.

(Continued)

*Primary Examiner* — Mark Budd
(74) *Attorney, Agent, or Firm* — DLA Piper LLP (US)

(57) ABSTRACT

A component that operates with acoustic waves includes a substrate including a piezoelectric material, a first electrode plane in which bottom electrode structures including an acoustically active bottom electrode are arranged directly on the substrate, and a top electrode arranged above the bottom electrode plane and which is electrically conductively connected to the bottom electrode structures, wherein excitation of the acoustic waves during operation of the component is effected exclusively or predominantly through the bottom electrode structures.

19 Claims, 8 Drawing Sheets

(56) References Cited

OTHER PUBLICATIONS

S. Benchabane et al., "Evidence for Complete Surface Wave Band Gap in a Piezoelectric Phononic Crystal," Physical Review E, vol. 73, No. 6, Jun. 1, 2006, pp. 065601-1-065601-4.

I. El-Kady et al., "Phononic band-gap crystals for radio frequency communications," Applied Physics Letters, vol. 92, No. 23, Jun. 10, 2008, pp. 233504-1-233504-3.

* cited by examiner

CONSTRUCTION ELEMENT THAT OPERATES WITH ACOUSTIC WAVES, AND METHOD FOR THE MANUFACTURE THEREOF

RELATED APPLICATIONS

This is a §371 of International Application No. PCT/EP2009/067306, with an international filing date of Dec. 16, 2009 (WO 2010/070000 A1, published Jun. 24, 2010), which is based on German Patent Application No. 10 2008 062 605.8, filed Dec. 17, 2008, the subject matter of which is incorporated by reference.

TECHNICAL FIELD

This disclosure relates to a component that operates with acoustic waves as well as a method for making such a component.

BACKGROUND

A widespread problem of components that operate with acoustic waves is that during the operation of the components, on the surface on which the wave is formed, undesirable diffractions of the wave occur, as do mode dispersions. A further undesirable effect is formation of mode peaks in the excited wave. It would furthermore be desirable to minimize or, if possible, to eliminate edge effects that occur. Undesirable edge effects include, for example, undesirable excitation and scattering in the region of the electrode gap, and also differences in wave velocity in the electrode gap region compared with the region between the electrodes. Moreover, formation of undesirable transverse modes can occur, for example, in the region of the electrode gaps.

It could therefore be helpful to provide a component that operates with acoustic waves which largely avoids undesired diffraction of the wave and likewise mode dispersion. It could also be helpful to eliminate mode peaks as far as possible without an energy loss and to avoid undesirable edge effects.

SUMMARY

We provide a component that operates with acoustic waves including a substrate including a piezoelectric material, a first electrode plane in which bottom electrode structures including an acoustically active bottom electrode are arranged directly on the substrate, and a top electrode arranged above the bottom electrode plane and which is electrically conductively connected to the bottom electrode structures, wherein the excitation of the acoustic waves during operation of the component is effected exclusively or predominantly through the bottom electrode structures.

We also provide a method for manufacturing an electroacoustic component including providing a substrate including a piezoelectric material, applying a first dielectric on partial regions of the substrate, applying a bottom electrode structure on partial regions of the substrate such that the bottom electrode structure has direct contact with the substrate, and applying a top electrode above the bottom electrode structure such that it is electrically conductively connected to the bottom electrode structure.

LIST OF REFERENCE SYMBOLS

Figure 1:
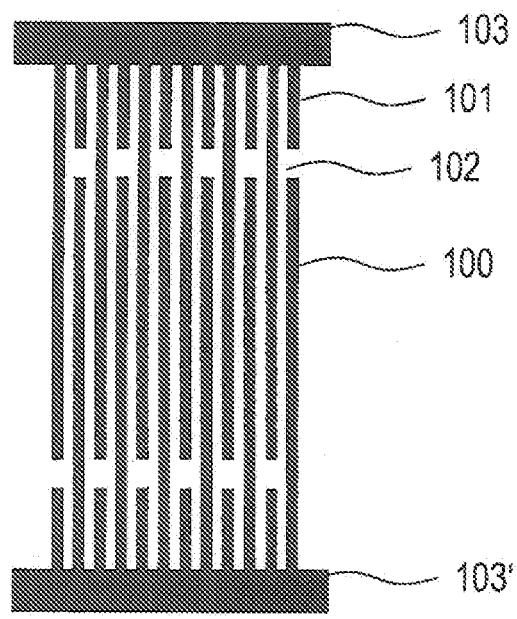
FIG. 1 shows a schematic plan view of a conventional electrode structure.

1 Substrate
2 First dielectric
3 Bottom electrode
4 Top electrode
5 Second dielectric
6 Busbar
7 Plated-through hole
10 Non-exciting, reflective electrode
11 Electrode having a first potential
12 Electrode having a second potential
100 Electrode
101 Stub finger
102 Transverse gap
103 Busbar having first polarity
103' Busbar having second polarity

DETAILED DESCRIPTION

We provide a component that operates with acoustic waves comprising a substrate composed of a piezoelectric material, a first electrode plane in which bottom electrode structures comprising an acoustically active bottom electrode are arranged directly on the substrate, a top electrode arranged above the bottom electrode plane and which is electrically conductively connected to the bottom electrode structures, wherein excitation of the acoustic wave during operation of the component is effected exclusively or predominantly through the bottom electrode structures.

By virtue of the electrode being split into a bottom electrode which is acoustically active and a top electrode, which merely performs the task of electrical conduction, it is now possible to shape the bottom electrode in a manner such as would not be possible without such splitting into two. This makes it possible to shape the acoustically active bottom electrode in a geometry in which diffraction and mode dispersions are significantly reduced in comparison to conventional electrode geometries. In particular, it is also possible to shape the electrode of the first electrode plane at its edges in accordance with the desired function. This is possible, inter alia, by virtue of the fact that the acoustically active bottom electrodes do not require lateral connection to an electrically conductive element such as, e.g., a busbar. Undesirable edge effects can be eliminated as a result.

It is now no longer necessary to make the aperture very large solely to minimize the diffraction effects at the edge of the acoustic track. A very large aperture would have the disadvantage that the electrical resistance is correspondingly high, and therefore so are the electrical losses.

The effect sought, namely that propagation velocity of the acoustic wave is intended to be lower in the outer regions than in the inner region, can now be implemented in a simple manner by the free choice of the geometry of the acoustically active bottom electrode. The propagation velocity can be achieved by reducing the metalization ratio η in the simplest case therefore by narrowing the electrode fingers. In conventional components, narrowing the electrodes toward the outside would have the negative effect that the conductivity decreases in the outer regions. By virtue of the fact that the electrical supply of the bottom electrode is now no longer dependent on the geometry of the bottom electrode itself and can be effected from any desired location of the bottom electrode, the problem of conductivity decreasing toward the outside can be solved by a corresponding geometry of the top electrode.

In shaping the top electrode, it is necessary in this case to take no or virtually no account of the interactions thereof with waves to be excited since the top electrode makes no or virtually no contribution to excitation of the wave. Consequently, the geometry of the top electrode can be designed such that the bottom acoustically active electrode is supplied with voltage such that is most expedient for the electrode form or the use of the component.

The component may furthermore comprise a first dielectric arranged on the substrate and into which the bottom electrode structures are embedded.

The bottom electrode preferably comprises a material having a large impedance jump by comparison with the material of the first dielectric. The impedance jump provides for sufficient reflection and, if appropriate, also for good waveguiding.

The thickness of the first dielectric may correspond at least to the thickness of the bottom electrode structures.

As a result, the entire bottom electrode structures are embedded into the first dielectric. However, the first dielectric can also have a height that is significantly greater than the height of the bottom electrode structures.

The top electrode and the bottom electrode structures may not be congruent. In this connection, "not congruent" should be understood to mean that the basic areas of the top electrode and of the bottom electrode in electrical contact therewith do not have the same geometry, that is to say form and size, over the entire area. This in turn means that the top electrode and the bottom electrode structure are not in contact by way of their entire area or cannot be brought to congruence.

The possibility for freely shaping the acoustically active electrode makes it possible, for example, to shape the electrode such that no transverse gaps are present, as a result of which undesirable excitations and disturbances of the wavefront which occur when the transverse gaps are present are omitted. The contour of the bottom acoustically active electrode can, for example, also be shaped as a hexagon, ellipse or circle.

The bottom electrode structures and the top electrode may comprise different materials.

Splitting the electrode structure into two makes it possible to optimize the material of the bottom electrode structure and likewise the material of the top electrode in each case in accordance with their tasks. Consequently, for the top electrode it is possible to use a material which conducts the current very well, but is not acoustically active. Consequently, in the choice for the material for the top electrode, it is not necessary to take into consideration what influence the material has on propagation of the wave, such as diffraction effects, for example. On the other hand, the bottom electrode structure does not have to have very good electrical conductivity as is the case in conventional components. As a result, the electrode material can also be better coordinated with the respectively surrounding material for example with regard to the impedance.

The component may comprise a busbar which is electrically conductively connected to the top electrode.

This enables constructions in which the bottom electrode is directly situated on the piezoelectric substrate and thus provides for very good coupling. In this case, however, the acoustically active bottom electrode is not connected directly to the busbar. This makes it possible that the bottom electrode structures can be shaped practically in any desired manner. They can, for example, also be subdivided into a multiplicity of individual electrodes. The top electrode electrically conductively connects the bottom electrode structures to the busbar.

The first dielectric electrically may insulate a subset of the bottom electrode structures from the busbar.

A subset of the bottom electrode structure may have no electrical contact with the busbar. Consequently, this subset of the bottom electrode structure can be electrically insulated from the busbar precisely by the first dielectric, for example. In this case, the electrical supply is effected via the top electrode.

The bottom electrode may comprise a plurality of acoustically exciting electrode structures. The top electrode electrically connects the bottom electrode structures respectively associated with a busbar to one another. For this purpose, it bears on the bottom electrode structures. Between the electrode structures of the bottom electrode, the top electrode can also bear on the substrate. Consequently, the top electrode is then also acoustically exciting. Preferably, it is designed to be more weakly exciting than the bottom electrode in this example. Disturbances initiated by the top electrode, if appropriate, are thus minimized.

The bottom electrode structures and the top electrode may be connected to one another via a plated-through hole through the first dielectric.

The first dielectric can have a significantly greater layer thickness than the first electrode plane and cover the bottom electrode structures in this case. Through the first dielectric, plated-through holes can be led to the top electrode such that the bottom electrode and the top electrode are electrically conductively connected to one another via the plated-through holes. Through the first dielectric, which can be arranged between the top and bottom electrodes and is merely interrupted by the plated-through holes, it is possible to largely suppress the excitation of an acoustic wave by the top electrode.

The plated-through holes and the top electrode may comprise the same material. This makes it possible, for example, to produce the plated-through holes and the top electrode in one method step. In this case, the plated-through holes likewise comprise a material which has a very good electrical conductivity, but at the same time is not acoustically active or is acoustically active only to a very small degree.

The component may comprise more than one top electrode. The component can also comprise more than one busbar. In this case, it is then possible for one portion of the top electrodes to be electrically conductively connected to one busbar, whereas another portion of the top electrodes are electrically conductively connected to another busbar.

Each bottom electrode structure may comprise a multiplicity of individual electrodes which are not electrically connected to one another in the bottom electrode plane.

It is thus possible for a component to have, in a manner distributed in the bottom electrode structure, a multiplicity of individual electrodes which are not in electrically conductive contact with one another. These individual electrodes can also have different geometries. Thus, by way of example, the individual electrodes arranged in the edge region of the component can have a different geometrical structure from the individual electrodes arranged in the interior of the electrode structure. The circumstance that the individual electrodes having the same polarity do not have to be in electrically conductive contact with one another makes it possible that the individual electrodes in the bottom electrode structure can be arranged virtually in any desired manner with respect to one another.

The individual electrodes in the plane of the bottom electrode structure may be configured such that they can excite an acoustic wave that propagates in two different lateral directions of the plane.

The plane of the bottom electrode structure is usually defined as the x-y plane. So, in this case, the x-direction is the direction perpendicular to the major axis (the axis along which the electrode has the largest extent) of the bottom electrodes and the y-direction is the direction parallel to the major axis of the bottom electrodes. Consequently, through the bottom electrode structure, for example, it is possible to excite a wave in the x-direction and a wave in the y-direction. The additional excitation of an acoustic wave in the y-direction makes it possible, for example, to reduce the diffraction losses.

With the conventional transducers it has not been possible heretofore for an acoustic wave also to be excited in the y-direction in a targeted manner in addition to a wave in the x-direction, the parameters of both waves being selectable. Shaping the bottom electrode in the components now makes it possible, for example, to excite in the y-direction a wave which has the same frequency and intensity as the wave excited in the x-direction.

Consequently, it is now possible to excite a 2-D wave. An ideal resonator would be one which oscillates only on a single mode. If success is achieved in exciting only this one single mode (standing wave) and insulating it well, then a very good quality factor can be realized. Superimposing a wave in the x-direction and a wave in the y-direction having the same frequency results in an energy distribution having phases that alternate in both directions. This very specific 2-D mode can then be excited particularly well when success is gained in driving the maxima and minima. This has not been possible hitherto with conventional transducers. By virtue of the electrodes being split into a top and a bottom, acoustically active electrode, the bottom electrode can be shaped such that they are in each case positioned precisely at the location of a defined maximum or minimum of the 1-D or 2-D standing wave. The electrical connection is effected via a top electrode in each case.

Excitation of the two acoustic waves may be effected with the same frequency.

In the component, it is possible to directly excite a wave having the same frequency both in the x-direction and in the y-direction. In the case of different frequencies, with such a component it is possible to produce a filter behavior by superimposition of the two mutually perpendicular modes.

Superimposition at identical frequencies leads to an excitation of a 2-D mode which corresponds to the natural mode pattern. The excitation of a 2-D mode makes it possible particularly effectively to avoid losses and obtain a high quality factor since energy "lost" as a result of scattering and diffraction of one 1-D mode can couple into the other 1-D mode that is vertical with respect thereto, and this energy is thus maintained overall for the 2-D mode.

The individual electrodes may be arranged such that an individual electrode to which a signal having a first polarity is applied is followed in each case in both lateral directions by an individual electrode with an applied signal having another polarity.

A component configured in this way is particularly well suited to exciting a 2-D mode as described above. A multiplicity of bottom electrodes which alternate with regard to their polarity both in the x-direction and in the y-direction can thus be arranged in the bottom electrode structure.

A wave may additionally be excited perpendicularly to the plane of the bottom electrode structure. Therefore, a wave may additionally also be excited in the z-direction. Consequently, a 3-D mode is generated. This can be employed, for example, in FBAR technology (Film Bulk Acoustic Wave Resonator). The functioning is comparable with that of a surface acoustic wave filter (SAW-filter), but with the difference that the acoustic wave is additionally propagated in the substrate in the case of FBAR technology. A component would thus be a hybrid between FBAR and SAW. As a result, specific modes can be selected even more selectively.

Some of the individual electrodes may be connected to a common top electrode. This means that it is not necessary for every individual electrode to be accompanied by a top electrode. A component can therefore comprise a multiplicity of individual electrodes, but does not simultaneously have to have a corresponding number of top electrodes electrically connected thereto. A component can therefore be shaped such that it comprises a multiplicity of individual electrodes in the bottom electrode structure, but a significantly smaller number of top electrodes.

The component may additionally comprise a second dielectric arranged on and between the structures of the top electrode.

The top electrodes are therefore embedded into the second dielectric. The acoustic impedance of the material of the second dielectric may be matched to the acoustic impedance of the top electrodes.

Embedding the top electrodes into a second dielectric having similar acoustic properties largely suppresses the reflection and change in velocity of the acoustic wave by the top electrode. If the second dielectric and the top electrodes have a very small impedance difference, then this avoids the need to position the top electrode precisely above the bottom electrode during manufacture of the component. This is because, on account of the small impedance difference, the acoustic wave sees hardly any difference between the material of the second dielectric and that of the top electrode and, consequently, nor does it see the precise position of the top electrode. Consequently, the precise position and also the thickness of the top electrode do not reflect a significant role, which distinctly facilitates production of the component.

Moreover, with the choice of the material of the bottom electrode, the velocity of the acoustic wave can be greatly reduced. As a result, a transverse waveguide can be realized in a simple manner, without the connections having to be taken particularly into consideration.

For the case where the bottom electrode is connected to the top electrode via plated-through holes, the top electrodes can, however, also be produced from a material which does not have to be acoustically similar to the second dielectric.

The multiplicity of bottom electrodes may form a "phononic bandgap." "Phononic bandgap" means an electrode arrangement in which there is a frequency range in which there is no propagation possibility for an acoustic wave independently of the wave type and the spatial direction. If a wave having a frequency adjacent to this range is excited, then it is not possible for the wave to expand into this frequency range. The wave is therefore confined by the "phononic bandgap."

Figure 7:
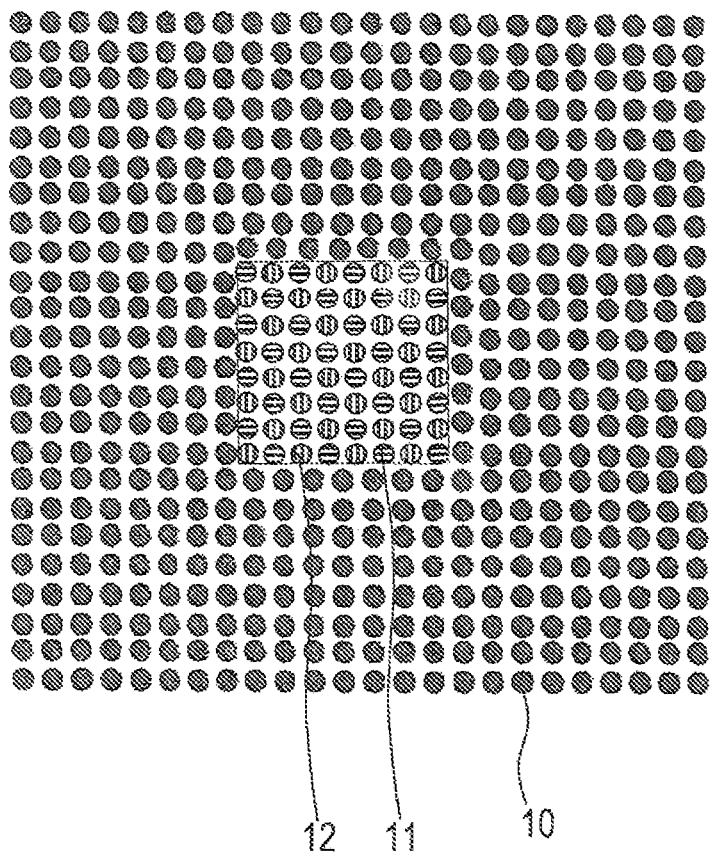
FIG. 7 shows an example in the schematic plan view in which the bottom electrode structure comprises non-exciting, reflective electrodes, and also electrodes having a first and a second potential.

The multiplicity of bottom electrodes may form a "phononic bandgap" with a built-in disturbance, as illustrated in FIG. 7, for example. In this case, a wave can be excited, but it is then totally reflected by its surroundings. Therefore, it cannot propagate and the entire acoustic energy remains in the region of the disturbance.

Besides the component itself, a method for the manufacture thereof is also disclosed.

One of our methods for manufacturing an electroacoustic component comprises the following method steps:
  providing a substrate composed of a piezoelectric material as method step A),
  applying a first dielectric on partial regions of a substrate as method step B),
  applying a bottom electrode structure on partial regions of the substrate such that the bottom electrode structure has direct contact with the substrate as method step C), and
  applying a top electrode above the bottom electrode structure such that it is electrically conductively connected to the bottom electrode structure as method step D).

Our methods may also further comprise as an additional method step E) applying a busbar such that the latter is electrically conductively connected to the top electrode. A direct electrical contact between the busbar and the bottom electrode structure is not necessary and can be excluded.

Our methods may also comprise, as an additional step, applying a second dielectric at least in the region of the top electrode as method step F).

The advantages of the individual methods arise correspondingly analogously to the advantages described for the corresponding examples of the component.

Various aspects of our components and methods will be explained in greater detail below with reference to figures and examples.

Turning now to the drawings, FIG. 1 shows the electrode structure of a conventional transducer in the schematic plan view. The transducer comprises an electrode 100 comprising electrode fingers, stub fingers 101 and intervening transverse gaps 102. In this case, in the electrode structure, the electrode fingers 100 and the stub fingers 101 are respectively alternately connected to one of the two busbars 103 and 103' and arranged in an alternating sequence in the direction of propagation of the acoustic wave. An intermeshing comb-like structure is thereby formed. In the case of an electrode structure shaped in this way, undesirable diffractions of the excited wave occur. To reduce diffraction, the aperture can be enlarged, for example, although this has the effect that the electrical resistance increases and the losses thus rise. Omitting the stub fingers 101 would result in an increase in the bulk wave conversion.

The electrodes 100 and also the stub fingers 101 are respectively electrically conductively connected to the busbars 103, 103' at the top side and underside, and the busbars in turn are electrically conductively connected to connection pads which are not illustrated here for reasons of clarity. A narrowing of the electrodes 100 toward the outside, that is to say in the direction of the busbars, would result in a decrease in conductivity.

Figure 2:
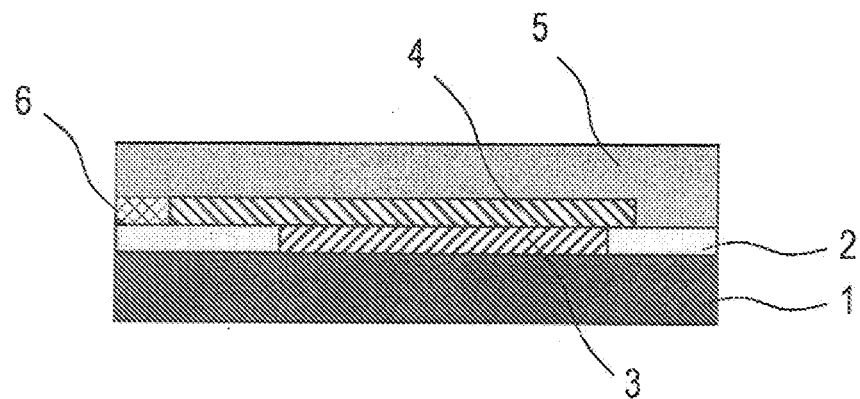
FIG. 2 shows a schematic side view of an example of the component.

FIG. 2 shows a schematic side view of an example of a component. The component comprises a substrate 1 arranged at the bottom in the figure and on which a bottom electrode 3 is arranged. The first dielectric 2 is likewise arranged on the substrate 1, around the bottom electrode 3. The top electrode 4 is arranged above the bottom electrode 3 such that at least partial overlapping and, consequently, an electrical contact of the bottom electrode 3 and of the top electrode 4 occur. The second dielectric 5 is arranged above the top electrode 4. The busbar 6 is arranged at a side area of the top electrode 4, between the first dielectric 2 and the second dielectric 5, the busbar being in electrically conductive contact with the top electrode 4. However, the busbar 6 is not in direct electrically conductive contact with the bottom electrode 3.

Figure 3:
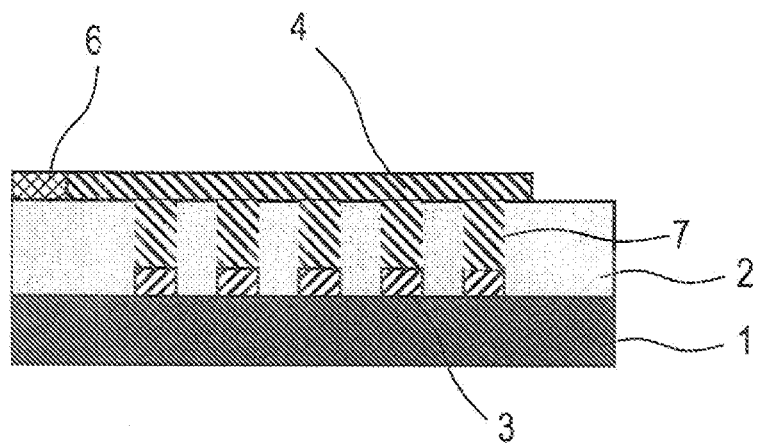
FIG. 3 shows a schematic side view of an example of the component which has plated-through holes.

FIG. 3 shows a further example of the component in schematic side view. The example comprises a substrate 1, on which a plurality of bottom electrodes 3 is arranged. The first dielectric 2 is likewise arranged on the substrate 1 and between the bottom electrodes 3, the first dielectric electrically conductively insulating the bottom electrodes 3 from one another. The top electrode 4 is arranged on the first dielectric 2. The top electrode 4 is in each case electrically conductively connected to a bottom electrode 3 via a plated-through hole 7. The component furthermore comprises a busbar 6 arranged laterally alongside the top electrode 4, the busbar being electrically conductively connected to the top electrode 4. However, the busbar 6 is not directly electrically conductively connected to any of the bottom electrodes 3.

Figure 4A:
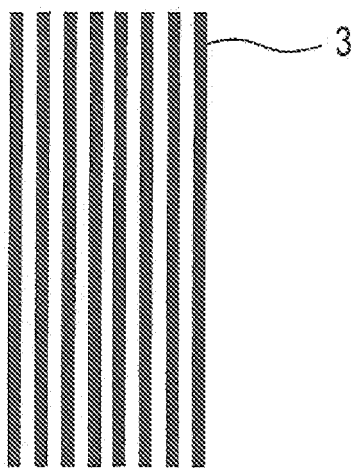
FIGS. 4a to 4c show in a schematic plan view in each case possible examples of the bottom electrodes.
Figure 4B:
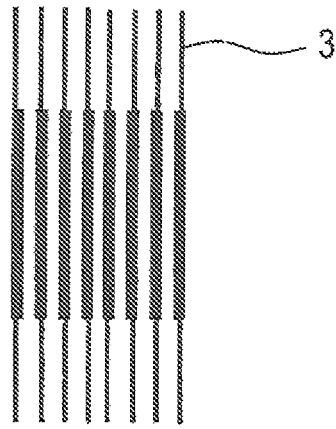
Figure 4C:
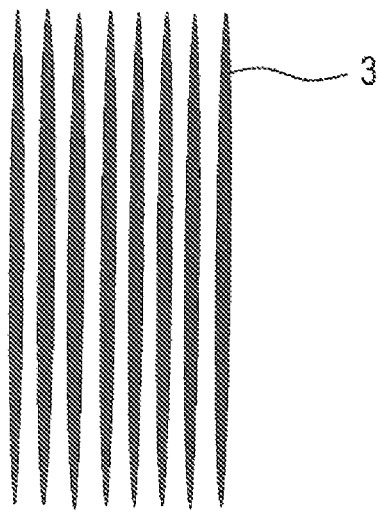

FIGS. 4a to 4c show different geometrical examples of the bottom electrodes 3.

FIG. 4a shows a possible geometrical example of the bottom electrodes 3. In this case, the bottom electrodes 3 have an elongated rectangular form which, however, is not interrupted by transverse gaps.

FIG. 4b shows a geometrical example of the bottom electrode 3 having, in the middle part, a more thickly shaped, elongated part with outer edges running parallel to one another, and, in each case at the two outer ends, a more narrowly shaped, elongated part with outer edges running parallel to one another. An electrode structure shaped in this way is possible in a component since the electrically conductive linking does not have to be effected via the outer sides which, in the event of the electrodes illustrated here being used in a conventional component, would lead to a reduction of the conductivity in the outer regions of the electrode.

FIG. 4c illustrates a further possible configuration of the bottom electrode structures. In this case, the bottom electrode 3 has the form of an elongated ellipse. A bottom electrode shaped in this way also makes it possible to excite a wave in a targeted manner parallel to the major axis of the ellipse. As a result it is possible, for example, to excite alongside a first wave, which is excited perpendicularly to the major axis of the ellipse, additionally a second wave, which is excited parallel to the major axis of the ellipse. A 2-D mode can thereby be excited.

The bottom electrode 3 can, for example, also have a bent form (not illustrated).

Figure 5:
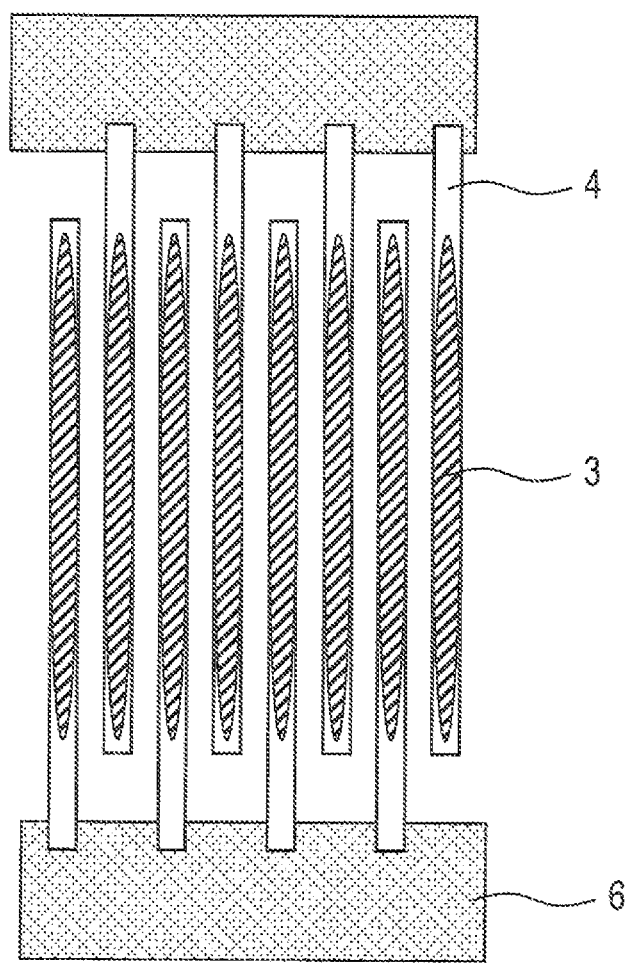
FIG. 5 shows in a schematic plan view an example comprising the bottom electrodes in accordance with FIG. 4c.

FIG. 5 illustrates an example of the component in a schematic plan view. For reasons of clarity, only the busbars 6, the top electrodes 4 and the bottom electrodes 3 are illustrated. Furthermore, for reasons of clarity, the top electrodes 4 are illustrated as transparent such that the underlying bottom electrodes 3 can be discerned. In this example, the bottom electrodes 3 are shaped as elongated ellipses such as are illustrated in FIG. 4c, for example. In this example, the top electrodes 4 are shaped as elongated rectangles, a top electrode 4 in each case completely covering a bottom electrode 3. The top electrodes 4 are respectively electrically conductively connected in an alternating fashion to the busbar 6 illustrated at the top and at the bottom in the figure. By contrast, there is no direct electrically conductive contact between the bottom electrodes 3 and the busbars 6.

Figure 6:
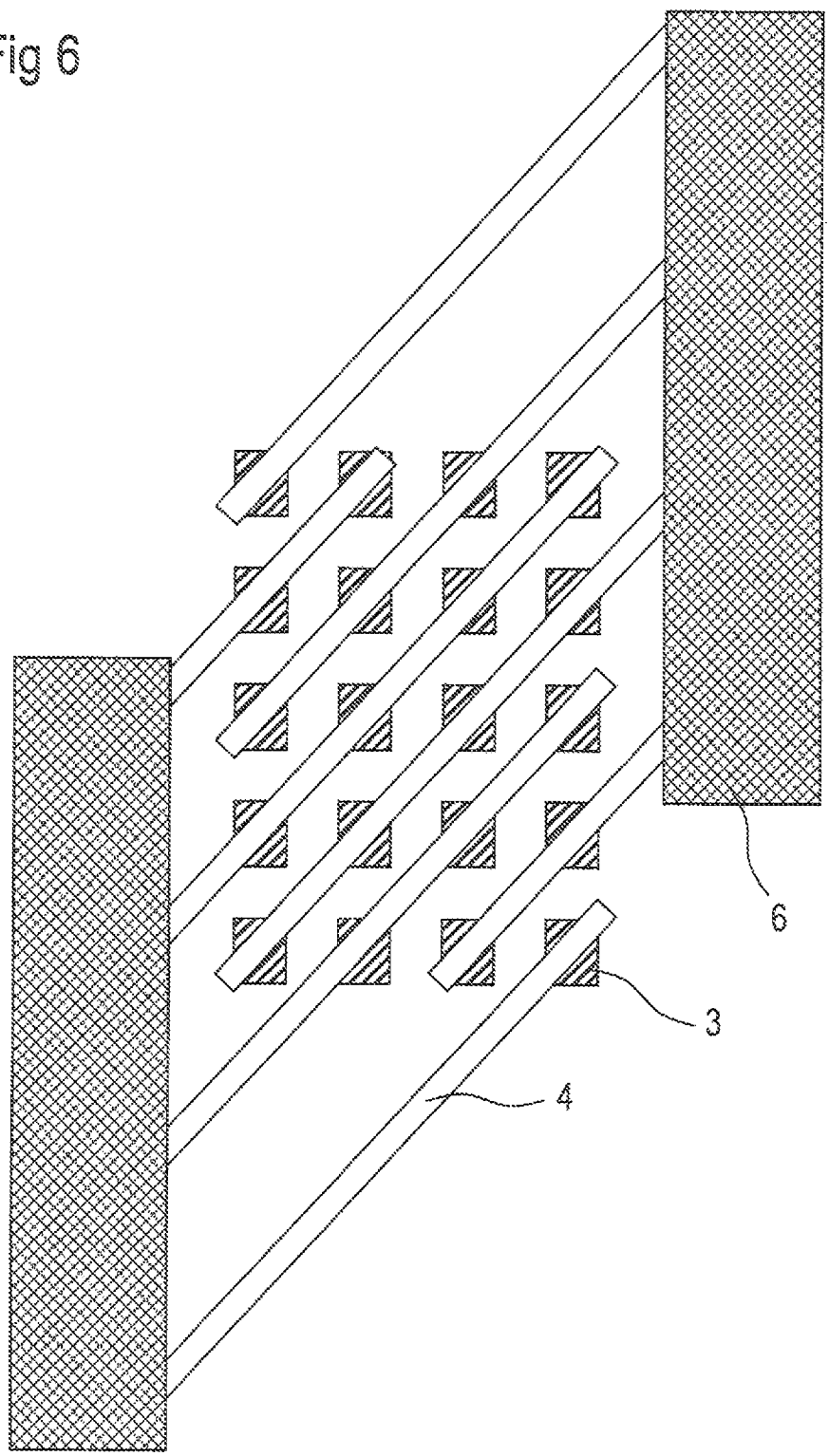
FIG. 6 shows in a schematic plan view an example in which a bottom electrode having a first polarity is in each case surrounded by electrodes having a second polarity.

FIG. 6 shows a schematic plan view of a further example of the component. For reasons of clarity, only the busbars 6, the top electrodes 4 and the bottom electrodes 3 are illustrated. In this example, the bottom electrodes 3 are shaped as a multiplicity of individual electrodes. The latter can be arranged as here in a regular grid having rows and columns situated vertically with respect thereto. The bottom electrodes 3 are electrically conductively connected to a busbar 6 via the top electrode 4. In this case, the number of bottom electrodes 3 which are respectively connected to a top electrode 4 varies. Each of the bottom electrode 3 is followed at a distance in a lateral direction by a further bottom electrode 3 which is respectively electrically conductively connected to the other busbar by comparison with the electrode itself. Consequently, the bottom electrode structure comprises bottom electrodes 3 whose polarity alternates in both spatial directions of the electrode structure. Through a suitable choice of the geometry of the bottom electrodes 3, a wave can in each case be excited in a targeted manner by such an arrangement. for example. in both lateral directions of the plane of the electrode structure. Consequently, an insulated 2-D mode can be excited by such an arrangement. It is possible to generate a so-called "standing wave" with respect to two spatial directions.

However, a bottom electrode having this or a similar structure can also be electrically connected to a top electrode having a structure similar to a conventional transducer as illustrated in FIG. 1, for example. In this case, the top electrode can also have stub fingers (see fingers 101 in FIG. 1) under which electrode structures of the bottom electrode can likewise be arranged.

FIG. 7 shows a schematic plan view of a bottom electrode structure. This electrode structure comprises non-exciting, reflective electrodes 10, and also electrodes having a first potential 11 and electrodes having a second potential 12. In this case, in the center of the electrode structure, the electrodes having a first potential 11 and the electrodes having a second potential 12 are respectively arranged alternately in both spatial directions. The exciting electrodes 11, 12 are surrounded by the non-exciting reflective electrodes 10 in a frame-type manner. In this case, the distance between the individual electrodes does not need to be identical, but can be varied to form energy concentrations, for example.

In this example, in the same way as in that according to FIG. 6, the "phononic bandgap" already mentioned is formed.

FIGS. 8a to 8e in each case show a schematic side view of a component in different method stages.

Figure 8A:

FIG. 8a shows a substrate 1, on which a first dielectric 2 has been applied in the edge regions. By way of example, $SiO_2$ can be used for the first dielectric 2. The first dielectric 2 can be applied by sputtering, for example. The first dielectric 2 can either be applied only in the edge regions or can alternatively be applied over the whole area and can be removed again in the central partial region in a further method step.

Figure 8B:
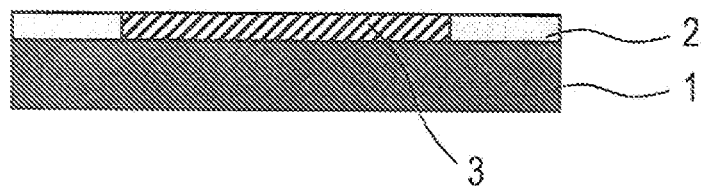

FIG. 8b shows a method stage such as could emerge from the method stage illustrated in FIG. 8a. For this purpose, in a further method step, the bottom electrode 3 has been applied on that partial region of the surface of the substrate 1 which is not covered by the first dielectric 2. The bottom electrode 3 can be applied, for example, by evaporation, sputtering or CVD. The material used for the bottom electrode 3 can comprise, for example, Au, Ag, Cu or some other heavy metal.

Figure 8C:
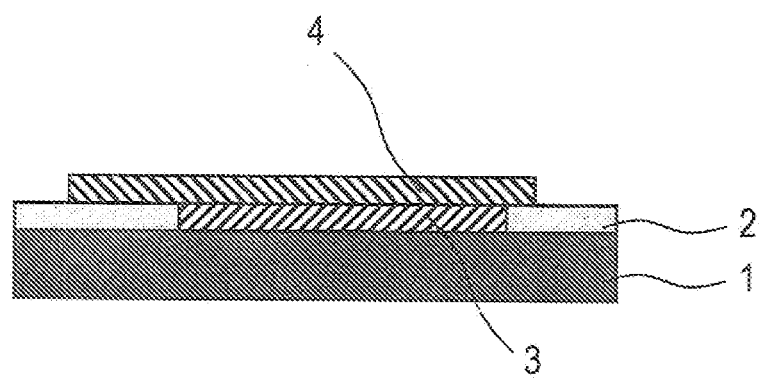

FIG. 8c shows a further method stage in a schematic side view. This could emerge, for example, from the method stage illustrated in FIG. 8b. For this purpose, the top electrode 4 has been applied in a further method step. The top electrode can be applied by evaporation, for example. By way of example, a material comprising Al can be used for the top electrode 4. In this example, the top electrode 4 has been applied such that it completely overlaps the bottom electrode 3 in the x-y plane. The problem in this process step consists in positioning the top electrode above the bottom electrode such that the acoustic reflection of the bottom electrode is not disturbed. However, if the top electrode consists of Al, for example, and if it is also embedded into a dielectric such as $SiO_2$, for example, then the impedance jump between the materials of dielectric and top electrode is very small. This has the consequence that the acoustic wave sees no difference between these two materials and, therefore, the precise positioning and also the thickness of the top electrode also do not play a significant part.

The material of the bottom electrode, by contrast, has a large impedance jump with respect to the surrounding material, which provides for sufficient reflection and, if appropriate, also good wave-guiding.

Figure 8D:
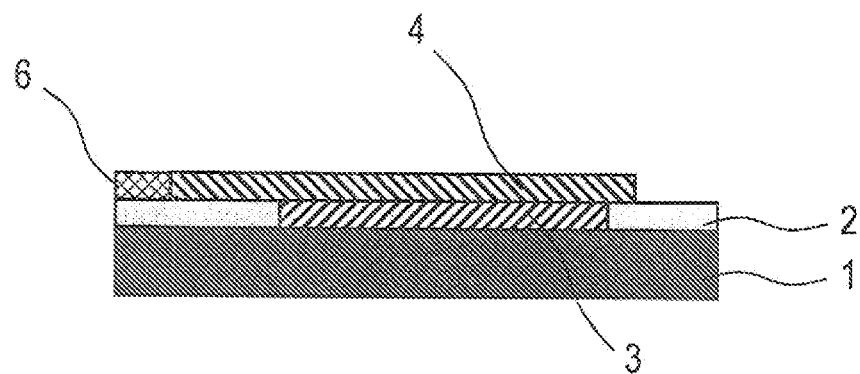

FIG. 8d illustrates a method stage of an example in schematic side view which, compared with the method stage illustrated in FIG. 8c, additionally comprises a busbar 6. By way of example, a material comprising Al can be used for the busbar 6. The busbar 6 is applied to the component such that it is in direct electrical contact with the top electrode 4. However, the busbar 6 does not have direct electrically conductive contact with the bottom electrode 3.

Figure 8E:
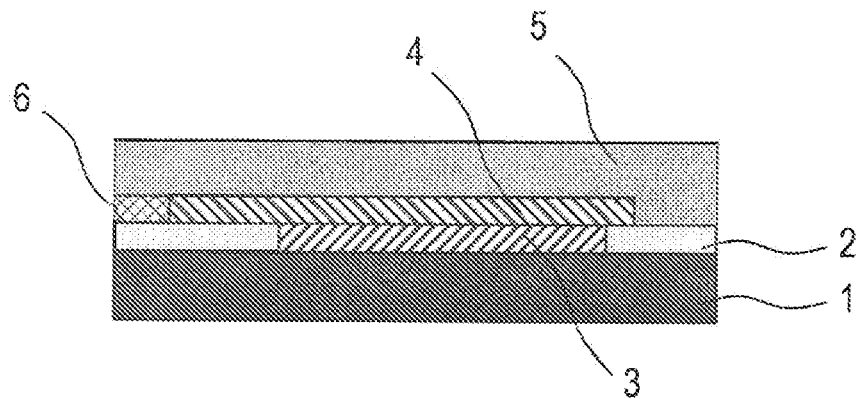

FIG. 8e illustrates in schematic side view an example of a component which corresponds to the component illustrated in FIG. 2. This could emerge, for example, from the example illustrated in FIG. 8d by virtue of the second dielectric 5 having been applied to the top side of the component in a further method step. The second dielectric 5 can be applied by PECVD (Plasma Enhanced Chemical Vapor Deposition) for example. By way of example, a material comprising $SiO_2$ can be used for the second dielectric 5.

This disclosure is not restricted by the description on the basis of the examples. Rather, the disclosure encompasses any novel feature and also any combination of features, which in particular includes any combination of features in the appended claims, even if the feature or the combination itself is not explicitly specified in the claims or examples.

The invention claimed is:

1. A component that operates with acoustic waves comprising:
   a substrate comprising a piezoelectric material;
   a first electrode plane in which bottom electrode structures comprising an acoustically active bottom electrode are arranged directly on the substrate; and
   a to electrode arranged above the bottom electrode plane and which is electrically conductively connected to the bottom electrode structures, and
   a busbar electrically conductively connected to the top electrode,
   wherein excitation of the acoustic waves during operation of the component is effected exclusively or predominantly through the bottom electrode structures, the top electrode electrically conductively connects the bottom electrode structures to the busbar and the acoustically active bottom electrode is not connected directly to the busbar.

2. The component according to claim 1, further comprising:
   a first dielectric arranged on the substrate and into which the electrode structures are embedded.

3. The component according to claim 2, wherein thickness of the first dielectric corresponds at least to thicknesses of the bottom electrode structures.

4. The component according to claim 1, wherein the top electrode and the bottom electrode structures are not congruent.

5. The component according to claim 1, wherein the bottom electrode structures and the top electrode comprise different materials.

6. The component according to claim 1, wherein the first dielectric electrically insulates a subset of the bottom electrode structures from the busbar.

7. The component according to claim 1, wherein the bottom electrode structures and the to electrode are connected to one another via a plated-through hole.

8. The component according to claim 7, wherein the plated-through hole and the top electrode comprise the same material.

9. The component according to claim 1, comprising more than one top electrode.

10. The component according to claim 1, wherein each bottom electrode structure comprises a multiplicity of individual electrodes not electrically connected to one another in a plane of the bottom electrode.

11. The component according to claim 10, wherein individual electrodes in the plane of the bottom electrode structure excite an acoustic wave that propagates in two different lateral directions of the plane.

12. The component according to claim 11, wherein excitation is effected with the same frequency.

13. The component according to claim 10, wherein individual electrodes are arranged such that an individual electrode to which a signal having a first, polarity is applied is followed in both lateral directions by an individual electrode having another polarity.

14. The component according to claim 11, wherein a wave is additionally excited perpendicularly to the plane of the bottom electrode structure.

15. The component according to claim 10, wherein some of the individual electrodes are connected to a common top electrode.

16. The component according to claim 1, further comprising:
   a second dielectric arranged on and between the top electrodes.

17. The component according to claim 16, wherein an acoustic impedance of material comprising the second dielectric is matched to an acoustic impedance of the top electrodes.

18. The component according to claim 10, wherein a multiplicity of bottom electrodes form a phononic bandgap.

19. The component according to claim 10, wherein a multiplicity of bottom electrodes form a phononic bandgap with a disturbance.

\* \* \* \* \*

UNITED STATES PATENT AND TRADEMARK OFFICE
CERTIFICATE OF CORRECTION

| | |
|---|---|
| PATENT NO. | : 8,674,583 B2 |
| APPLICATION NO. | : 13/139756 |
| DATED | : March 18, 2014 |
| INVENTOR(S) | : Ruile et al. |

It is certified that error appears in the above-identified patent and that said Letters Patent is hereby corrected as shown below:

In the Claims:

In Column 10

At line 50, claim 1, please change "a to" to -- a top --.

Signed and Sealed this
First Day of July, 2014

Michelle K. Lee
*Deputy Director of the United States Patent and Trademark Office*